(12) United States Patent
Wang

(10) Patent No.: US 10,177,027 B2
(45) Date of Patent: Jan. 8, 2019

(54) METHOD FOR REDUCING CRACKS IN A STEP-SHAPED CAVITY

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Xianchao Wang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 8 days.

(21) Appl. No.: 15/679,914

(22) Filed: Aug. 17, 2017

(65) Prior Publication Data
US 2018/0068888 A1 Mar. 8, 2018

(30) Foreign Application Priority Data

Sep. 6, 2016 (CN) .......................... 2016 1 0805514

(51) Int. Cl.
*H01L 21/56* (2006.01)
*H01L 21/768* (2006.01)
(Continued)

(52) U.S. Cl.
CPC .... *H01L 21/76804* (2013.01); *B81C 1/00587* (2013.01); *H01L 21/02326* (2013.01);
(Continued)

(58) Field of Classification Search
CPC .......... H01L 21/02136; H01L 2924/10; H01L 2924/1011; H01L 2924/1015; H01L 2924/102; H01L 2924/146
See application file for complete search history.

(56) References Cited

U.S. PATENT DOCUMENTS

| 7,008,812 B1 * | 3/2006 | Carley ................. B81B 7/0077 438/52 |
| 2006/0291674 A1 | 12/2006 | Gong et al. |
| 2010/0065930 A1 | 3/2010 | Nakatani |

OTHER PUBLICATIONS

European Application No. 17186434.1, Extended European Search Report dated Dec. 22, 2017, 8 pages.

* cited by examiner

*Primary Examiner* — Cheung Lee
(74) *Attorney, Agent, or Firm* — Kilpatrick Townsend & Stockton LLP

(57) ABSTRACT

A method for manufacturing a semiconductor device includes providing a semiconductor substrate including a substrate and a multilayer film having a step-shaped portion on the substrate; forming a protective layer covering the step-shaped portion of the multilayer film; forming a capping layer having a plurality of steps on the protective layer covering the semiconductor substrate; and removing at least one layer of the multilayer film to form a cavity that is defined by the capping layer and a remaining multilayer film that has the at least one layer removed. The thus formed semiconductor device does not have cracks in the steps of the capping layer when performing an etch process, thereby improving the performance of the semiconductor device.

18 Claims, 6 Drawing Sheets

(51) Int. Cl.
 *H01L 21/02* (2006.01)
 *H01L 21/3205* (2006.01)
 *H01L 23/532* (2006.01)
 *H01L 29/423* (2006.01)
 *B81C 1/00* (2006.01)
(52) U.S. Cl.
 CPC .... *H01L 21/02505* (2013.01); *H01L 21/3205* (2013.01); *H01L 21/56* (2013.01); *H01L 23/5329* (2013.01); *H01L 29/4232* (2013.01); *B81B 2201/0257* (2013.01); *B81C 2201/014* (2013.01); *H01L 2924/0002* (2013.01)

METHOD FOR REDUCING CRACKS IN A STEP-SHAPED CAVITY

CROSS-REFERENCES TO RELATED APPLICATIONS

The present application claims priority to Chinese patent application No. 201610805514.3, filed on Sep. 6, 2016, the content of which is incorporated herein by reference in its entirety.

The present application is related to copending U.S. patent application, entitled "METHOD FOR PREVENTING EXCESSIVE ETCHING OF EDGES OF AN INSULATOR LAYER", the content of which is incorporated herein by reference in its entirety.

BACKGROUND OF THE INVENTION

The present invention relates to a micro electromechanical system (MEMS) microphone, a manufacturing method thereof, and an electronic device containing the same.

MEMS microphones are one of the most successful MEMS products, which are compatible with existing integrated circuits manufacturing techniques. MEMS microphones can be manufactured using process techniques of semiconductor devices. Thanks to the continuous development of CMOS process technology, MEMS microphones can be made very small and have been used in a variety of wearable communication devices including mobile phones, tablet PCs, notebooks, still cameras, video cameras, hearing aids and others.

MEMS microphones can generally be capacitive microphones including a vibrating membrane (lower electrode) fixedly formed on a substrate and facing an opening disposed on a backside of the substrate, and a fixed plate (upper electrode) being suspended above the vibrating membrane. A sealed cavity is disposed between the vibrating membrane and the fixed plate. A MEMS microphone enables detection of a capacitive value change due to the displacement of the vibrating membrane in the sealed cavity, and the detected value change is then processed.

Current process techniques for manufacturing MEMS microphones employ wet etching, e.g., using a buffered oxide etch (BOE) process, to remove the silicon oxide ($SiO_2$) to form a cavity, so that the membrane can vibrate in the cavity. The shape and volume of the cavity structure may affect the operation of the microphone. In general, silicon nitride (SiN) with good corrosion resistance can be used as a support for forming the cavity structure.

FIG. 1A is a cross-sectional view depicting a partial structure of an intermediate stage of a conventional microphone in a manufacturing method according to the prior art. Referring to FIG. 1A, a structure of a half of a conventional microphone is shown to include a substrate 100, a first silicon dioxide layer 101 on substrate 100, a first polysilicon layer 111 on first silicon dioxide layer 101, a second silicon dioxide layer 102 on first polysilicon layer 111, a second polysilicon layer 112 on second silicon dioxide layer 102, and a silicon nitride layer 140 overlying the substrate. Through-holes 130 are formed through silicon nitride layer 140 and second polysilicon layer 112 and extending to second silicon dioxide layer 102. A recess is formed in substrate 100 to expose first silicon dioxide layer 101. Next, a BOE etch process is performed on the silicon dioxide layers through the through-holes and the recess to form cavities, as shown in FIG. 1B.

In the above-described process, in the stepwise structure of the silicon nitride layer (as indicated by the dashed circle in FIG. 1B), in particular when the step height is greater than a certain thickness, the density of the silicon nitride growth is low in the step, so the silicon nitride can be easily removed in the BOE etch process, so that cracks will be formed, thereby significantly affecting the reliability of the device.

As described above, the prior art technique does not provide a crack-free silicon nitride layer when using a BOE process, so that the reliability of the microphone is adversely affected. Therefore, there is a need for a novel method for manufacturing a MEMS microphone that provides a step-shaped silicon nitride layer that is crack-free.

BRIEF SUMMARY OF THE INVENTION

The present inventor discovered the above-described problems and provides a novel method for manufacturing a semiconductor device. The thus, manufactured semiconductor device has a capping layer including multiple steps that are free of cracks during an etch process in the manufacture.

In accordance with the present invention, a method for manufacturing a semiconductor device may include providing a semiconductor substrate including a substrate and a multilayer film having a step-shaped portion on the substrate; forming a protective layer covering the step-shaped portion of the multilayer film; forming a capping layer on the protective layer covering the semiconductor substrate; and removing at least one layer of the multilayer film to form a cavity that is defined by the capping layer and a remaining multilayer film that has the at least one layer removed.

In one embodiment, the multilayer film includes a first insulator layer on the substrate; a first semiconductor layer on the first insulator layer; and a second insulator layer on the first semiconductor layer. The first insulator layer, the first semiconductor layer, and the second insulator layer form a step-shaped structure of the multilayer film.

In one embodiment, forming the protective layer may further include concurrently forming a patterned second semiconductor layer on the second insulator layer; and the second semiconductor layer is separated from the protective layer.

In one embodiment, the second semiconductor layer and the protective layer include the same material. Concurrently forming the patterned second semiconductor layer includes forming a material layer covering the semiconductor structure; and performing a patterning process on the material layer to separate the material layer into a first portion configured to be the second semiconductor layer and a second portion on the step-shaped portion of the multilayer film configured to be the protective layer.

In one embodiment, the substrate includes silicon; the first and second semiconductor layers each include polysilicon; the first and second insulator layers each include silicon dioxide; and the capping layer comprises silicon nitride.

In one embodiment, the method may further include forming a first through-hole through the second semiconductor layer extending to the second insulator layer.

In one embodiment, forming the capping layer may further include performing an etch process on the capping layer to form a first recess exposing a surface portion of the first semiconductor layer, a second recess exposing a surface portion of the second semiconductor layer, and a second through-hole aligned with the first through-hole. The first and second through-holes collectively form a through-hole through the capping layer and the second semiconductor layer and extending to the second insulator layer.

In one embodiment, the method may further include, after forming the capping layer and prior to forming the cavity, forming a first contact layer on a bottom of the first recess; and forming a second contact layer on a bottom and sidewalls of the second recess, the second contact layer extending on an upper surface of the capping layer.

In one embodiment, the method may further include, after forming the first and second contact layers and prior to forming the cavity, removing a portion of the substrate to form a third recess, the third recess exposing a portion of a bottom surface of the first insulator layer.

In one embodiment, removing the at least one layer of the multilayer film includes, after forming the third recess, removing the second insulator layer to form the cavity; and removing a portion of the first insulator layer to expose the portion of the bottom surface of the first insulator layer.

In one embodiment, providing the semiconductor substrate includes providing the substrate; forming a patterned first insulator layer on the substrate; forming a patterned first semiconductor layer on the first insulator layer exposing a portion of the first insulator layer; and forming a patterned second insulator layer on the first semiconductor layer exposing a portion of the first semiconductor layer.

In one embodiment, forming the patterned second insulator layer on the first semiconductor layer may further include concurrently forming a portion of the patterned second insulator layer on the substrate; and the method further includes, after forming the protective layer and prior to forming the capping layer, removing the portion of the patterned second insulator layer on the substrate.

In one embodiment, the protective layer covers partially the step-shaped portion or entirely the step-shaped portion of the multilayer film.

In one embodiment, the protective layer includes polysilicon, silicon nitride, copper, gold, or platinum.

Embodiments of the present invention also provide a semiconductor device. The semiconductor device may include a substrate; a film on the substrate; a capping layer on the film, the capping layer including a step-shaped inner surface portion; a cavity defined by the capping layer and the film; and a protective layer on the step-shaped inner surface portion of the capping layer.

In one embodiment, the film includes a first insulator layer on the substrate, and a first semiconductor layer on the first insulator layer; the cavity is defined by the capping layer and the first semiconductor layer.

In one embodiment, the semiconductor device also includes a patterned second semiconductor layer on a second inner surface portion of the capping layer different from the step-shaped inner surface portion, the second semiconductor layer is separated from the protective layer.

In one embodiment, the second semiconductor layer and the protective layer are of a same material.

In one embodiment, the substrate includes silicon; the first and second semiconductor layers each include polysilicon; the first and second insulator layers each comprise silicon dioxide; and the capping layer comprises silicon nitride.

In one embodiment, the semiconductor also includes a first through-hole in the second semiconductor layer extending to the cavity. In one embodiment, the semiconductor device further includes a first recess in the capping layer exposing a surface portion of the first semiconductor layer; a second recess in the capping layer exposing a surface portion of the second semiconductor layer; and a second through-hole aligned with the first through-hole and collectively forming a through-hole extending through the capping layer and the second semiconductor layer to the cavity.

In one embodiment, the semiconductor device further includes a first contact layer on a bottom of the first recess, and a second contact layer on a bottom and sidewalls of the second recess and extending on an upper surface portion of the capping layer.

In one embodiment, the semiconductor device further includes a third recess in the substrate and in the first insulator layer exposing a lower surface portion of the first semiconductor layer.

In one embodiment, the protective layer covers partially the step-shaped inner surface portion or entirely the step-shaped inner surface portion of the capping layer. In one embodiment, the protective layer includes polysilicon, silicon nitride, copper, gold, or platinum.

The following description, together with the accompanying drawings, will provide a better understanding of the nature and advantages of the claimed invention.

BRIEF DESCRIPTION OF THE DRAWINGS

The accompanying drawings, which are included to provide a further understanding of the invention and are incorporated in and constitute a part of this application, illustrate certain embodiments of the invention. In the drawings.

DETAILED DESCRIPTION OF THE INVENTION

Figure 1A:
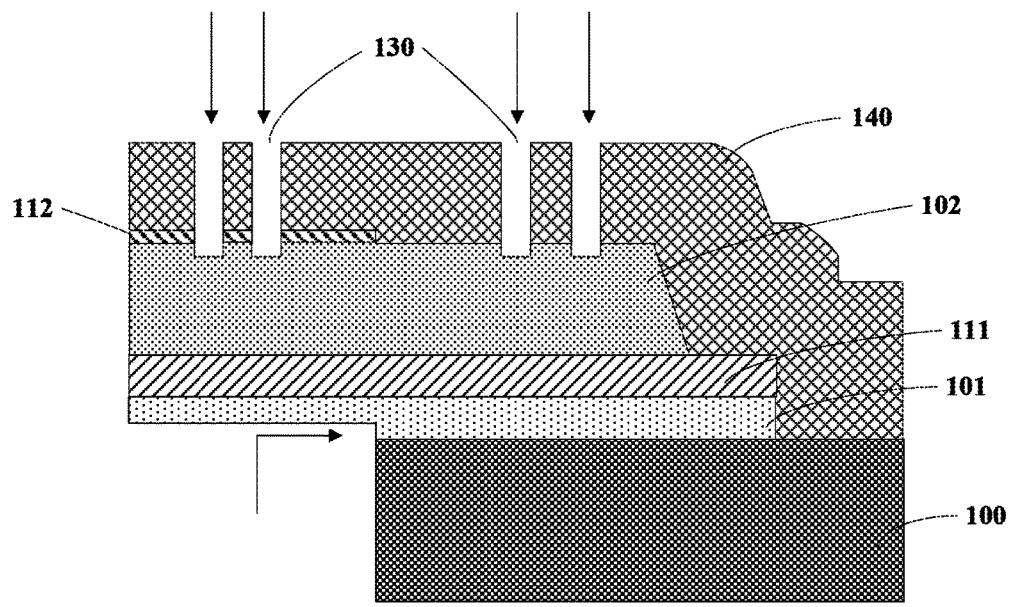
FIG. 1A is a cross-sectional view depicting a stage of a method of manufacturing a MEMS microphone according to the prior art.
Figure 1B:
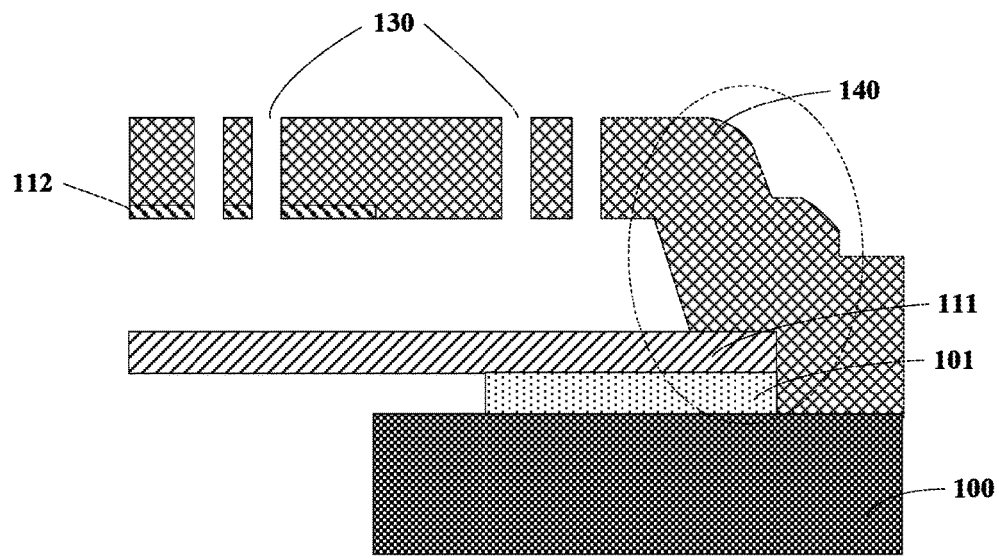
FIG. 1B is a cross-sectional view depicting a stage of a method of manufacturing a MEMS microphone for forming a cavity using a BOE process according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention.

Figure 2:
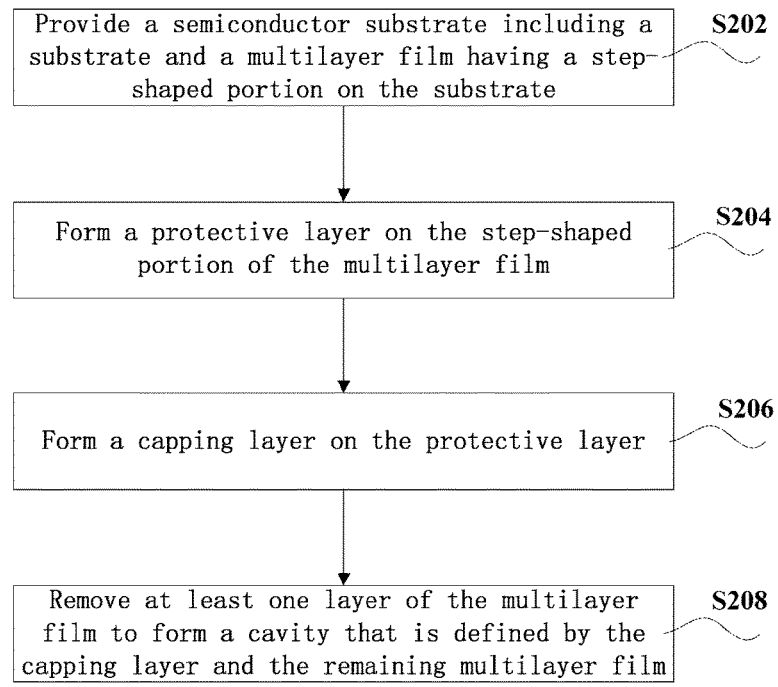
FIG. 2 is a simplified flow chart of a method for manufacturing a semiconductor device according to an embodiment of the present invention.

FIG. 2 is a simplified flow chart of a method for manufacturing a semiconductor device according to an embodiment of the present invention. The method may include the following steps:

Step S202: providing a semiconductor structure. The semiconductor structure includes a substrate and a multi-layer film on the substrate. The multilayer film has a step-shaped portion.

Step S204: forming a protective layer on the multilayer film. For example, the protective layer may cover partially the step-shaped portion of the multilayer film or the entire step-shaped portion of the multilayer film.

Step S206: forming a capping layer on the protective layer covering the semiconductor structure.

Step S208: removing at least one layer of the multilayer film to form a cavity including the capping layer and the remaining multilayer film.

In the embodiment, by forming a protective layer on the step-shaped portion of the multilayer film and then forming a capping layer on the protective layer covering the semiconductor structure, the inner surface of the capping layer is formed having a step-shaped structure (i.e., inner surface steps of the capping layer) such that during the formation of the cavity by removing at least one layer of the multilayer film (e.g., by way of a BOE etch process), the protective layer can protect the inner surface of the capping layer from being etched, so that the problem of cracks developed on the step-shaped capping layer due to damage caused by the etching process can be prevented and the reliability of the device can be improved.

FIGS. 3A to 3G are cross-sectional views depicting stages of a method of manufacturing a semiconductor device according to an embodiment of the present invention. A manufacturing process of a semiconductor device according to an embodiment of the present invention will now be described in detail with reference to FIGS. 3A to 3G.

Figure 3A:
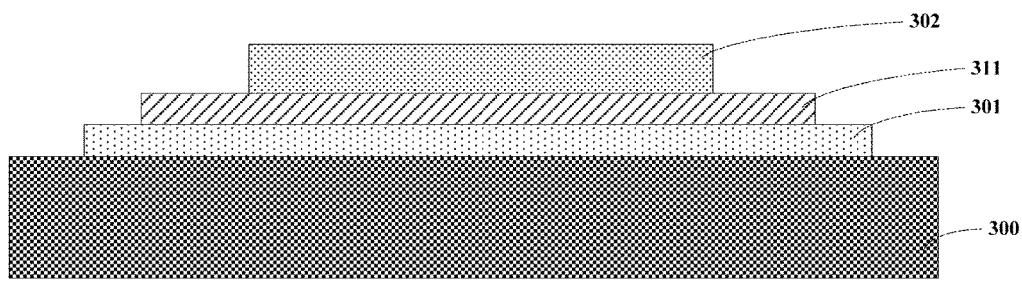
FIGS. 3A to 3G are cross-sectional views depicting stages of a method of manufacturing a semiconductor device according to an embodiment of the present invention.

Referring to FIG. 3A, a semiconductor structure is provided. The semiconductor structure includes a substrate 300 and a multilayer film on the substrate. The multilayer film has a step-shaped portion. In one example embodiment, substrate 300 may include silicon.

In one embodiment, referring to FIG. 3A, the multilayer film may include a first insulator layer 301 on substrate 300, a first semiconductor layer 311 on first insulator layer 301, and a second insulator layer 302 on first semiconductor layer 311. First insulator layer 301, first semiconductor layer 311, and second insulator layer 302 form a step-shaped structure having a plurality of steps. For example, first insulator layer 301 and second insulator layer 302 each may include silicon dioxide, and first semiconductor layer 311 may include polysilicon. The process of forming the multilayer film will be described in detail later below.

Figure 3B:
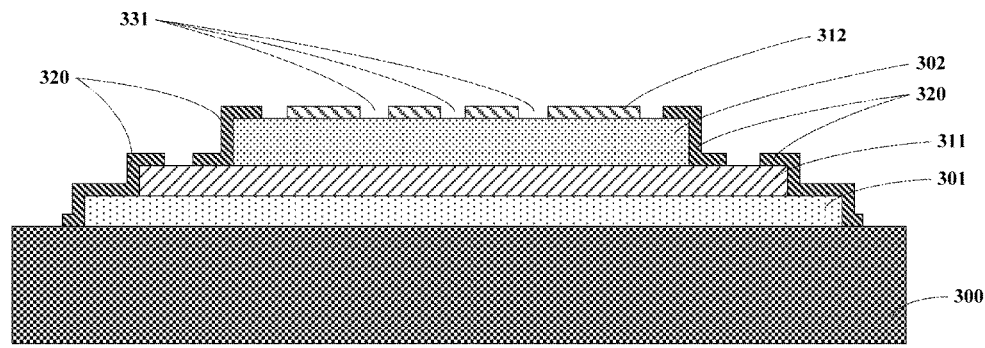

Next, referring to FIG. 3B, a protective layer 320 is formed covering the steps (in the step-shaped portion). In one embodiment, protective layer 320 may include polysilicon, silicon nitride, copper (Cu), gold (Au), platinum (Pt), and the like. For example, a high-density silicon nitride may be used for the protective layer. The density of the silicon nitride may be greater than the density of the silicon nitride of the capping layer that is subsequently formed. Of course, those of skill in the art will appreciate that other acid insoluble materials may also be used for forming the protective layer, and the scope of the present invention is thus not limited thereto.

In one embodiment, protective layer 320 has a thickness in the range between 0.1 um and 3 um, e.g., 0.5 um, 1 um, 2 um, etc.

In one embodiment, the process of forming the protective layer covering the steps of the step-shaped portion may include forming a patterned second semiconductor layer 312 on second insulator layer 302, and forming a protective layer 320 on the steps, protective layer 320 is isolated (spaced apart or separated) from second semiconductor layer 312, as shown in FIG. 3B. Second semiconductor layer 312 may include polysilicon.

In one embodiment, portions of the protective layer on different steps (of the step-shaped portion) may be disconnected from each other, i.e., the protective layer may cover partially the step-shaped portion of the multilayer film. In another embodiments, the portions of the protective layer on the different steps may be connected together, i.e., the protective layer may cover the entire step-shaped portion of the multilayer film.

In one embodiment, second semiconductor layer 312 and protective layer 320 may be of the same material. In a preferred embodiment, the second semiconductor layer and the protective layer each are of polysilicon. In one embodiment, the process of forming the second semiconductor layer and the protective layer may include forming a material layer on the semiconductor structure of FIG. 3A, e.g., using a deposition process. In one embodiment, the process of forming the second semiconductor layer and the protective layer may also include patterning the material layer to separate the material layer into disconnected portions, with some portions of the material layer on second insulator layer 302 as semiconductor layer 312 and some other portions of the material layer on the steps as protective layer 320. This process does not increase the number of mask layers as compared to the prior art, so it can be implemented without additional manufacturing costs.

In another embodiment, second semiconductor layer 312 and protective layer 320 may have different materials. For example, semiconductor layer 312 may include polysilicon, and second insulator layer 302 may include silicon nitride.

In yet another embodiment, the process of forming the second semiconductor layer and the protective layer may include forming semiconductor layer 312 on second insulator layer 302, and then forming protective layer 320 on the steps. Alternatively, protective layer 320 is formed on the steps, thereafter, semiconductor layer 312 is formed on second insulator layer 302.

In one embodiment, the method further includes forming through-holes 331 in second semiconductor layer 312 extending to second insulator layer 302, as shown in FIG. 3B. In an example embodiment, the first through-holes may be formed by patterning the second semiconductor layer. In another example embodiment, the first through-holes may be formed in the step of patterning the material layer for forming the second semiconductor layer and the protective layer.

Next, a capping layer is formed on the protective layer covering the semiconductor structure. The capping layer may include silicon nitride.

The step of forming the capping layer will be described with reference to FIGS. 3C and 3D.

Figure 3C:
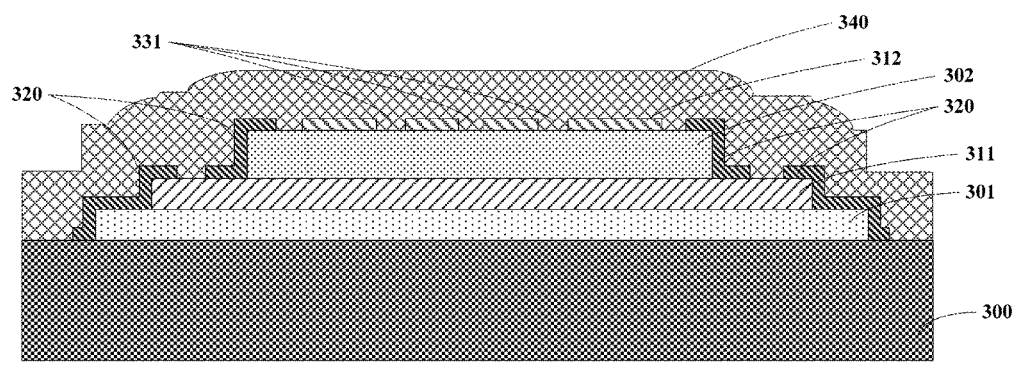

In one embodiment, the step of forming the capping layer on the protective layer covering the semiconductor structure may include forming a capping layer 340 using a deposition process on the semiconductor structure, as shown in FIG. 3C. In the previous step, since the multilayer film (e.g., first insulator layer 301, first semiconductor layer 311, second insulator layer 302) has a step-shaped portion, the inner surface of capping layer 340 formed thereon also has a step-shaped structure, as shown in FIG. 3C.

Figure 3D:
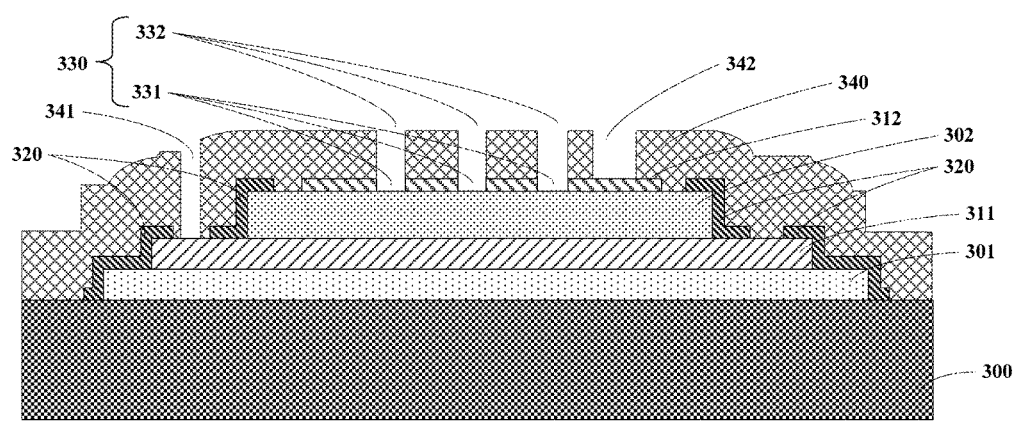

In one embodiment, the step of forming the capping layer on the protective layer covering the semiconductor structure may also include performing an etch process on capping layer 340 to form a first recess 341 exposing a portion of the surface of first semiconductor layer 311, a second recess 342 exposing a portion of the surface of second semiconductor layer 312, and second through-holes 332 that are aligned with first through-holes 331, as shown in FIG. 3D. First through-holes 331 and second through-holes 332 form collectively a through-hole 330 extending through capping layer 340 and second semiconductor layer 312 to a surface of second insulator layer 302. Thus, a capping layer is formed according to some embodiments of the present invention.

Figure 3E:
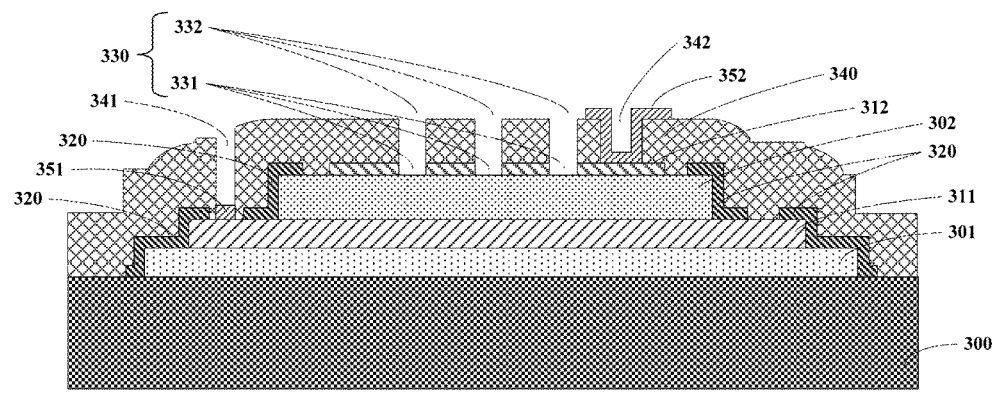

Next, in one embodiment, after forming the capping layer and prior to forming a cavity, the method may further include forming a first contact layer 351 on at least the bottom of first recess 341, and a second contact layer 352 on the bottom and sidewalls of second recess 342, second contact layer 352 may extend to the upper surface of capping layer 340, as shown in FIG. 3E. In one embodiment, the first contact layer may be formed on the bottom and sidewalls of first recess 341 and extending to the upper surface of capping layer 340, but separated from second contact layer 352. In one embodiment, first contact layer 351 and second contact layer 352 each may include a metal, such as aluminum, copper, or tungsten.

Figure 3F:
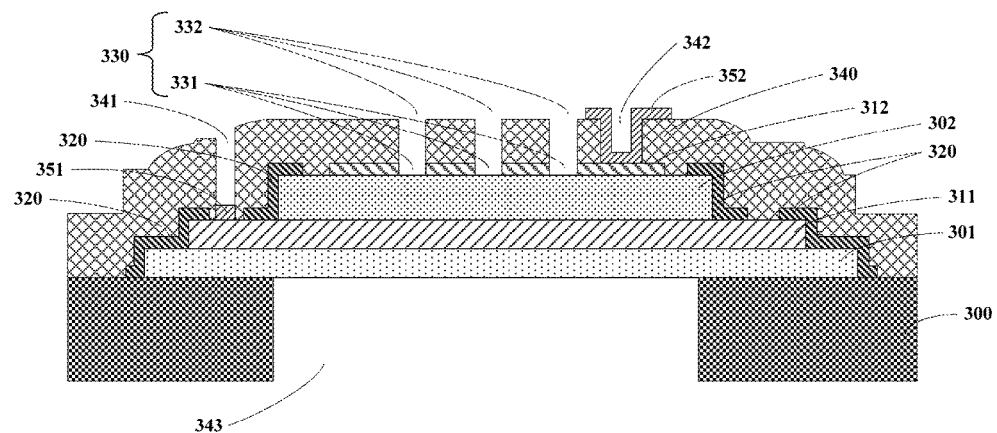

Next, in one embodiment, after forming the first and second contact layers and prior to forming a cavity, the method may further include removing a portion of substrate 300 to form a third recess 343 that exposes a portion of the lower surface of first insulator layer 301, as shown in FIG. 3F.

Figure 3G:
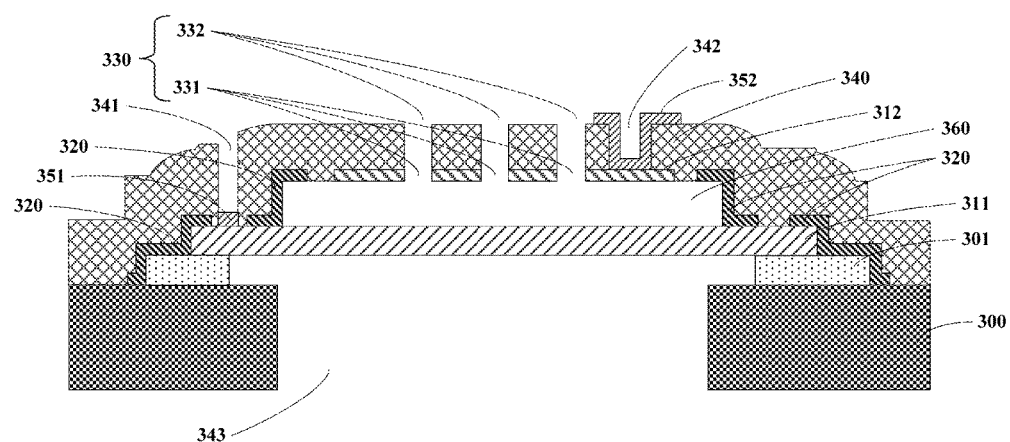

Next, in one embodiment, the process of removing at least one layer of the multilayer film to form a cavity may include, after forming third recess 343, removing second insulator layer 302 to form a cavity 360 that is covered by capping layer 340 and having first semiconductor layer 311 as a bottom, and a portion of first insulator layer 301 to expose a portion of the lower surface of first semiconductor layer 311, as shown in FIG. 3G.

In one embodiment, second insulator layer 302 and a portion of first insulator layer 301 may be removed using a BOE process. In one example embodiment, the second insulator layer may be removed by injecting hydrofluoric acid as an etching solution through through-hole 330 into second insulator layer 302 to form cavity 360, and injecting hydrofluoric acid as an etching solution through third recess 343 into first insulator layer 301 to remove a portion of the first insulator layer to expose the lower surface of semiconductor layer 311.

Thus, embodiments of the present invention provide a method for manufacturing a semiconductor device. Using the above-described method, it is possible to form a protective layer on the steps of the inner surface of the capping layer such that the protective layer can protect the capping layer during the removal of the second insulator layer (e.g., using the BOE etch process), so that the steps of the inner surface of the capping layer is not etched. Thus, the problems of having cracks on the steps of the capping layer caused by the etching process of the prior art can be eliminated, and the reliability of the device can be improved.

FIGS. 4A to 4E are cross-sectional views depicting stages of a method of manufacturing a semiconductor device according to an embodiment of the present invention. A manufacturing process of a semiconductor device according to an embodiment of the present invention will now be described in detail with reference to FIGS. 4A to 4C and FIG. 3A.

Figure 4A:
FIGS. 4A to 4E are cross-sectional views depicting stages of a method of manufacturing a semiconductor device according to an embodiment of the present invention.

In one embodiment, referring to FIG. 4A, the step of providing a semiconductor structure may include providing a substrate 300 that can include, for example, a silicon substrate.

Figure 4B:
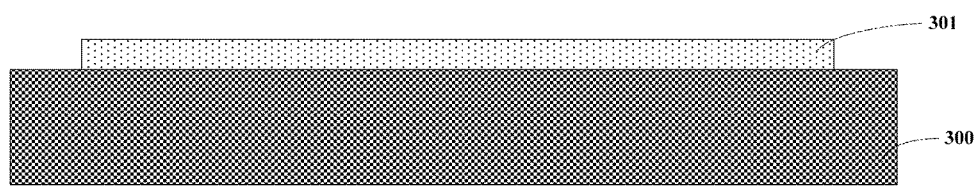

Next, referring to FIG. 4B, a patterned first insulator layer 301 is formed on substrate 301 and exposing a portion of the substrate. For example, first insulator layer 301 exposes an edge portion of substrate 300. In one embodiment, the step of forming first insulator layer 301 may include a deposition process. In one embodiment, first insulator layer 301 is patterned to expose an edge portion of substrate 300, as shown in FIG. 4B.

As used herein, the term "edge portion" refers to a portion of a structure (e.g., a layer, a film, a substrate, or the like) extending from the side edge of the structure to the middle of the structure for a certain distance. The certain distance can be determined according to actual requirements.

Figure 4C:
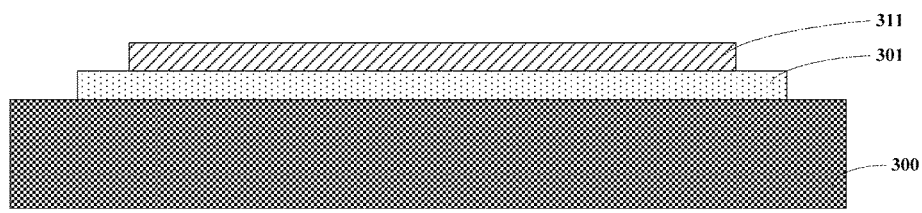

Next, referring to FIG. 4C, a patterned first semiconductor layer 311 is formed on first insulator layer 301 and exposes a portion of first insulator layer 301. For example, first semiconductor layer 311 exposes an edge portion of first insulator layer 301. In one embodiment, the step of forming the first semiconductor layer may include a deposition process to form first semiconductor layer 311 on the structure shown in FIG. 4B. In one embodiment, the step may further include patterning first semiconductor layer 311 to expose an edge portion of first insulator layer 301, as shown in FIG. 4C.

Next, referring to FIG. 3A, a patterned second insulator layer 302 is formed on first semiconductor layer 311 and exposes a portion of the second semiconductor layer. For example, second insulator layer 302 exposes an edge portion of first semiconductor layer 311. In one embodiment, the step of forming the second insulator layer may include a deposition process to form second insulator layer 302 on the structure shown in FIG. 4C. In one embodiment, the step may further include patterning second insulator layer 302 to expose an edge portion of first semiconductor layer 311.

Thus, a method of manufacturing a semiconductor structure as shown in FIG. 3A is provided.

Figure 4D:
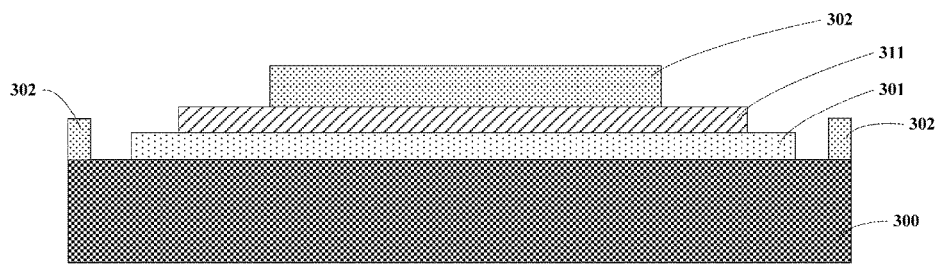
Figure 4E:
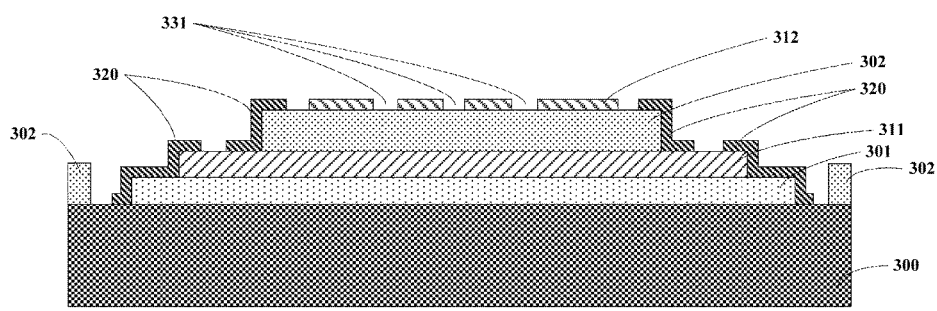

In one embodiment, referring to FIG. 4D, the process for forming patterned second insulator layer 302 on first semiconductor layer 311 also includes forming a portion of second insulator layer 302 on substrate 300. Thereafter, second semiconductor layer 312 and protective layer 320 are formed on the structure using the above-described process steps, as shown in FIG. 4E. In one embodiment, after forming the protective layer and prior to forming the capping layer, the method may further include removing a portion of second insulator layer 302 on substrate 300, e.g., using a patterning process, to form the structure shown in FIG. 3B. In the embodiment, the method includes performing two patterning processes: the first patterning process removing a portion of the second insulator layer on first semiconductor layer 311 to expose an edge portion of first semiconductor layer 311, the patterned region is an internal portion of a chip. The second patterning process removes a portion of the second insulator layer on the substrate, the patterned region is a periphery portion of the chip. The two patterning processes are required because, in some cases, the process capability of patterning equipment may be limited and the height of the second insulator layer that is patterned two times may not be uniform. If the inside portion and the periphery portion of the chip are opened by patterned once, some portions of the chip may not be opened or some portions of the chip may be excessively removed causing damage to the underlying material. This is the reason to perform two patterning processes according to one embodiment of the present invention.

Embodiments of the present invention also provide a semiconductor device. The semiconductor device may include a substrate (e.g., a silicon substrate). In one embodiment, the semiconductor device may further include at least one film on the substrate. In one example embodiment, the at least one film may include one-layer film, a two-layer film, a three-layer film, or multilayer film having more than 3 layers. In one embodiment, the semiconductor device may further include a capping layer on the at least one film. The capping layer and the at least one film form (define) a cavity. The capping layer includes a step-shaped inner surface. In one embodiment, the semiconductor device may further include a protective layer on the step-shaped inner surface of the capping layer. In an exemplary embodiment, the protective layer may cover a portion of (i.e., partially) the step-shaped surface of the capping layer or the entire step-shaped surface of the capping layer. In one embodiment, the protective layer may include polysilicon, silicon nitride, copper, gold, or platinum.

A semiconductor device will be described in detail with reference to FIG. 3G.

In one embodiment, referring to FIG. 3G, the semiconductor device may include a substrate 300 (e.g., silicon substrate), at least one film on substrate 300. For example, as shown in FIG. 3G, the at least one film may include a first insulator layer 301 on substrate 300 and a first semiconductor layer 311 on first insulator layer 301. Substrate 300 and first insulator layer 301 expose a portion of the lower surface of first semiconductor layer 311. The first insulator layer may include silicon dioxide. The first semiconductor layer may include polysilicon.

Referring still to FIG. 3G, the semiconductor device may further include a capping layer 340 on the at least one film. Capping layer 340 and first semiconductor layer 311 form together (define) a cavity 360. As shown in FIG. 3G, capping layer 340 has a step-shaped inner surface portion and may include silicon nitride.

Referring still to FIG. 3G, the semiconductor device may further include a protective layer 320 on the step-shaped inner surface (having multiple step-shaped portions) of capping layer 340. The protective layer is configured to prevent the step-shaped inner surface portion of the capping layer from being etched in order to improve the reliability of the semiconductor device.

Referring still to FIG. 3G, in one embodiment, the portions of the protective layer on different step-shaped portions of the capping layer may be separated from each other, i.e., the protective layer only partially covers the step-shaped inner surface of the capping layer. In another embodiment, the portions of the protective layer on different step-shaped portions of the capping layer are connected to each other, i.e., the protective layer covers the entire step-shaped inner surface of the capping layer.

In one embodiment, referring still to FIG. 3G, the semiconductor device may further include a patterned second semiconductor layer 312 on the inner surface of capping layer 340. Protective layer 320 and second semiconductor layer 312 are separated from each other, so that the protective layer does not affect the connection between the inside portion and the periphery portion of the semiconductor device as not to affect the operation of the semiconductor device. In one embodiment, second semiconductor layer 312 may include polysilicon.

In one embodiment, second semiconductor layer 312 and protective layer 320 may have the same material. In an exemplary embodiment, second semiconductor layer 312 and protective layer 320 each may include polysilicon. In another embodiment, second semiconductor layer 312 and protective layer 320 may have different materials. For example, second semiconductor layer 312 may include polysilicon, and protective layer 320 may include silicon nitride.

In one embodiment, referring still to FIG. 3G, the semiconductor device may further include a through-hole 331 in second semiconductor layer 312 extending through cavity 360.

In one embodiment, referring still to FIG. 3G, the semiconductor device may further include a first recess 341 exposing a portion of the surface of first semiconductor layer 311, a second recess 342 exposing a portion of the surface of second semiconductor layer 312, and a second through-hole 332 aligned with first through-hole 331. First through-hole 331 and second through-hole 332 collectively form a through-hole 330 extending through capping layer 340 and second semiconductor layer 312 to cavity 360.

In one embodiment, referring still to FIG. 3G, the semiconductor device may further include a first contact layer 351 on the bottom of first recess 341 and a second contact layer 352 on the bottom and sidewalls of second recess 352. Second contact layer 352 may extend to the upper surface of capping layer 340. In one embodiment, first contact layer 351 may be disposed on the bottom and sidewalls of first recess 341 and on the upper surface of capping layer 340. First contact layer 351 and second contact layer 352 are separated from each other. In one embodiment, first contact layer 351 and second contact layer 352 each may include a metal such as aluminum, copper, or tungsten, respectively.

In some embodiments, the semiconductor device in FIG. 3G may be used as a microphone in a MEMS device, in which first semiconductor layer 311 operates as a diaphragm for the microphone, through-hole 330 operates as a sound hole for the microphone, and cavity 360 operates as a resonator. First semiconductor layer 311 and second semiconductor layer 312 form a capacitor, and first contact layer 351 and second contact layer 352 are the metal connections of the two electrode plates of the capacitor. The capacitor changes its capacitance value according to the vibration of the diaphragm based on the sound pressure, thereby converting sound energy into electrical energy.

According to the present invention, by forming a protective layer on the steps of the capping layer, it is possible to effectively prevent cracks from occurring at the steps of the capping layer caused by etching in the manufacturing process, thereby improving the reliability of the microphone and the semiconductor device.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. The terms "forming" and "depositing" are used interchangeably.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor structure including a substrate and a multilayer film having a step-shaped portion, the-multilayer film comprising a first insulator layer on the substrate, a first semiconductor layer on the first insulator layer, and a second insulator layer on the first semiconductor layer;
   forming a protective layer covering the step-shaped portion of the multilayer film;
   forming a capping layer on the protective layer covering the semiconductor structure; and
   removing at least one layer of the multilayer film to form a cavity that is defined by the capping layer and a remaining multilayer film that has the at least one layer removed.

2. The method of claim 1, wherein forming the protective layer further comprises:
   concurrently forming a patterned second semiconductor layer on the second insulator layer; the second semiconductor layer being separated from the protective layer.

3. The method of claim 2, wherein the second semiconductor layer and the protective layer comprise a same material, and concurrently forming the patterned second semiconductor layer comprises:
   forming a material layer covering the semiconductor structure; and
   performing a patterning process on the material layer to separate the material layer into a first portion configured to be the second semiconductor layer and a second portion on the step-shaped portion of the multilayer film configured to be the protective layer.

4. The method of claim 2, wherein:
   the substrate comprises silicon;
   the first and second semiconductor layers each comprise polysilicon;
   the first and second insulator layers each comprise silicon dioxide; and
   the capping layer comprises silicon nitride.

5. The method of claim 2, further comprising:
   forming a first through-hole through the second semiconductor layer extending to the second insulator layer.

6. The method of claim 5, wherein forming the capping layer comprises:
   performing an etch process on the capping layer to form a first recess exposing a surface portion of the first semiconductor layer, a second recess exposing a surface portion of the second semiconductor layer, and a second through-hole aligned with the first through-hole,
   wherein the first and second through-holes collectively form a through-hole through the capping layer and the second semiconductor layer and extending to the second insulator layer.

7. The method of claim 6, further comprising, after forming the capping layer and prior to forming the cavity:
- forming a first contact layer on a bottom of the first recess; and
- forming a second contact layer on a bottom and sidewalls of the second recess, and extending on an upper surface of the capping layer.

8. The method of claim 7, further comprising, after forming the first and second contact layers and prior to forming the cavity:
- removing a portion of the substrate to form a third recess, the third recess exposing a portion of a bottom surface of the first insulator layer.

9. The method of claim 8, wherein removing the at least one layer of the multilayer film comprises:
- after forming the third recess, removing the second insulator layer to form the cavity; and
- removing a portion of the first insulator layer to expose the portion of the bottom surface of the first insulator layer.

10. The method of claim 2, wherein providing the semiconductor structure comprises:
- providing the substrate;
- forming a patterned first insulator layer on the substrate;
- forming a patterned first semiconductor layer on the first insulator layer exposing a portion of the first insulator layer; and
- forming a patterned second insulator layer on the first semiconductor layer exposing a portion of the first semiconductor layer.

11. The method of claim 10, wherein forming the patterned second insulator layer on the first semiconductor layer further comprises:
- concurrently forming a portion of the patterned second insulator layer on the substrate; and the method further comprising, after forming the protective layer and prior to forming the capping layer:
- removing the portion of the patterned second insulator layer on the substrate.

12. The method of claim 1, wherein the protective layer covers partially the step-shaped portion or entirely the step-shaped portion of the multilayer film.

13. The method of claim 1, wherein the protective layer comprises polysilicon, silicon nitride, copper, gold, or platinum.

14. A semiconductor device, comprising:
- a substrate;
- a film comprising a first insulator layer on the substrate, and a first semiconductor layer on the first insulator layer;
- a capping layer on the film and including a step-shaped inner surface portion;
- a cavity defined by the capping layer and the first semiconductor layer; and
- a protective layer on the step-shaped inner surface portion of the capping layer.

15. The semiconductor device of claim 14, further comprising:
- a patterned second semiconductor layer on a second inner surface portion of the capping layer different from the step-shaped inner surface portion, the second semiconductor layer being separated from the protective layer.

16. The semiconductor device of claim 15, wherein the second semiconductor layer and the protective layer comprise a same material.

17. The semiconductor device of claim 15, further comprising a first through-hole in the second semiconductor layer extending to the cavity.

18. The semiconductor device of claim 17, further comprising:
- a first recess in the capping layer exposing a surface portion of the first semiconductor layer;
- a second recess in the capping layer exposing a surface portion of the second semiconductor layer; and
- a second through-hole aligned with the first through-hole and collectively forming a through-hole extending through the capping layer and the second semiconductor layer to the cavity.

* * * * *